(12) United States Patent
Ohkubo et al.

(10) Patent No.: US 12,296,402 B2
(45) Date of Patent: May 13, 2025

(54) LASER PROCESSING APPARATUS

(71) Applicant: DISCO CORPORATION, Tokyo (JP)

(72) Inventors: Hironari Ohkubo, Tokyo (JP); Yuta Yoshida, Tokyo (JP); Kuo Wei Wu, Tokyo (JP); Keita Obara, Tokyo (JP); Shinya Honda, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 665 days.

(21) Appl. No.: 17/449,863

(22) Filed: Oct. 4, 2021

(65) Prior Publication Data

US 2022/0118547 A1  Apr. 21, 2022

(30) Foreign Application Priority Data

Oct. 15, 2020 (JP) .................................. 2020-173689

(51) Int. Cl.
*B23K 26/03* (2006.01)
*B23K 26/06* (2014.01)
(Continued)

(52) U.S. Cl.
CPC ........ *B23K 26/032* (2013.01); *B23K 26/0626* (2013.01); *B23K 26/364* (2015.10);
(Continued)

(58) Field of Classification Search
CPC .............. B23K 26/032; B23K 26/0626; B23K 26/364; B23K 26/402; B23K 26/0665;
(Continued)

(56) References Cited

U.S. PATENT DOCUMENTS 6,323,457 B1   11/2001 Jung
2006/0131289 A1*  6/2006 Jyumonji ........... B23K 26/0853
                                                        219/121.65
(Continued)

FOREIGN PATENT DOCUMENTS

JP      2003320466 A    11/2003
JP      2007284288 A    11/2007
(Continued)

OTHER PUBLICATIONS

Machine Translation of Odanaka, JP 2018-202468, performed Oct. 31, 2024 (Year: 2018).*
Japanese Patent Application JP 2020 0173689 A: English translation of Office Action, Jul. 30, 2024 (4 pages).

*Primary Examiner* — Brian W Jennison
(74) *Attorney, Agent, or Firm* — Greer, Burns & Crain, Ltd (57) ABSTRACT

A laser processing apparatus includes a laser beam applying unit for applying a laser beam to a workpiece, an image capturing unit for producing a captured image of the workpiece that includes a captured image of light emitted from the workpiece when the laser beam is applied to the workpiece by the laser beam applying unit, and a control unit. The laser beam applying unit includes a laser oscillator for emitting a laser beam and a condensing lens for converging the laser beam onto the workpiece. The control unit includes a determining section for determining a state of the laser beam applied to the workpiece, on the basis of the shape of the captured image of the light that is included in the captured image of the workpiece.

17 Claims, 7 Drawing Sheets

(51) Int. Cl.
*B23K 26/364* (2014.01)
*B23K 26/402* (2014.01)
*B23K 103/00* (2006.01)
*G06T 7/00* (2017.01)
*H01L 21/67* (2006.01)

(52) U.S. Cl.
CPC ............ *B23K 26/402* (2013.01); *G06T 7/001* (2013.01); *H01L 21/67115* (2013.01); *H01L 21/67282* (2013.01); *B23K 26/0665* (2013.01); *B23K 2103/56* (2018.08); *G06T 2207/10152* (2013.01); *G06T 2207/30148* (2013.01); *G06T 2207/30164* (2013.01)

(58) Field of Classification Search
CPC .............. B23K 2103/56; B23K 26/073; B23K 26/0736; B23K 2101/40; B23K 2103/52; B23K 26/0853; B23K 26/38; B23K 26/702; B23K 2101/36; B23K 26/0643; B23K 26/0648; B23K 37/0461; G06T 7/001; G06T 2207/10152; G06T 2207/30148; G06T 2207/30164; H01L 21/67115; H01L 21/67282; H01L 21/67092; H01L 21/78
See application file for complete search history.

(56) References Cited

U.S. PATENT DOCUMENTS

| | | | |
|---|---|---|---|
| 2007/0096763 A1* | 5/2007 | Ehrmann ........... | B23K 26/0861 |
| | | | 324/754.03 |
| 2013/0217153 A1 | 8/2013 | Knippels et al. | |
| 2018/0094972 A1* | 4/2018 | Kojo .................... | G01J 1/4257 |
| 2019/0074221 A1* | 3/2019 | Nomaru .............. | B23K 26/352 |
| 2019/0383753 A1* | 12/2019 | Zhang ................ | G01N 21/95607 |
| 2020/0078884 A1* | 3/2020 | Nie .................... | B23K 37/0408 |
| 2020/0164463 A1* | 5/2020 | Shibazaki .......... | B23K 26/0344 |
| 2020/0290157 A1* | 9/2020 | Okuma ................ | B23K 26/062 |

FOREIGN PATENT DOCUMENTS

| | | |
|---|---|---|
| JP | 2009291818 A | 12/2009 |
| JP | 2013086130 A | 5/2013 |
| JP | 2013154366 A | 8/2013 |
| JP | 2017069340 A | 4/2017 |
| JP | 2017120820 A | 7/2017 |
| JP | 2018058081 A | 4/2018 |
| JP | 2018202468 A | 12/2018 |
| JP | 2019121624 A | 7/2019 |
| JP | 6693612 B1 | 5/2020 |

* cited by examiner

LASER PROCESSING APPARATUS

BACKGROUND OF THE INVENTION

Field of the Invention

The present invention relates to a laser processing apparatus for processing a workpiece such as a semiconductor wafer with a laser beam.

Description of the Related Art

In the process of manufacturing device chips for use in electric appliances such as mobile phones or personal computers, first, a plurality of intersecting projected dicing lines (streets) are established on the face side of a wafer made of a material such as a semiconductor. Then, devices such as integrated circuits (ICs) or large-scale integration (LSI) circuits are formed in respective areas demarcated on the face side of the wafer by the projected dicing lines. Thereafter, the wafer is divided along the projected dicing lines, producing individual device chips each including one of the devices.

The wafer is divided by a laser processing apparatus, for example, that applies a laser beam to the wafer to process the wafer therewith. The laser processing apparatus includes a chuck table for holding a workpiece such as a wafer thereon and a laser beam applying unit for applying a laser beam to the workpiece held on the chuck table to process the workpiece with the laser beam. The laser beam applying unit converges the laser beam that has a wavelength absorbable by the workpiece onto an upper surface, i.e., the face side, of the workpiece to process the workpiece by way of ablation (see JP 2003-320466A). If the output power of the laser beam varies while the laser beam is processing the workpiece, then the workpiece may suffer a processing failure. To avoid such a difficulty, the laser processing apparatus monitors the output power of the laser beam periodically with a power meter (see JP 2009-291818A).

However, for measuring the output power of the laser beam with the power meter, it is necessary either to cause the power meter to block the optical path of the laser beam or to interrupt the laser processing operation and apply the laser beam to the power meter. At any rate, since the workpiece cannot be processed with the laser beam during the measurement of the output power of the laser beam with the power meter, the laser processing apparatus is problematic in that the efficiency with which to process the workpiece with the laser beam is lowered.

SUMMARY OF THE INVENTION

One solution to the above drawback would be to incorporate a mirror for transmitting part of the laser beam therethrough in the optical path of the laser beam within the laser beam applying unit, for example. For example, the laser beam that is emitted from a laser oscillator is divided by the mirror such that part of the laser beam is applied to the workpiece to process the workpiece therewith and the other part of the laser beam is applied to the power meter to allow the power meter to monitor the output power of the laser beam. In such a case, since the added mirror makes it possible to process the workpiece with the laser beam and also to monitor the output power of the laser beam at the same time, the workpiece can be processed with higher processing efficiency. However, the proposed arrangement fails to detect problems occurring outside of the laser beam applying unit, such as dirt smeared on an outer surface of a condensing lens at the end of the optical path of the laser beam applying unit, tending to prevent the laser beam from being applied to the workpiece as planned. In other words, there have been demands in the art for some means for monitoring the state of a laser beam actually applied to a workpiece, in order to detect problems inside as well as problems outside of a laser beam applying unit that applies the laser beam to the workpiece.

It is therefore an object to the present invention to provide a laser processing apparatus that is capable of monitoring the state of a laser beam applied to a workpiece.

In accordance with an aspect of the present invention, there is provided a laser processing apparatus including a chuck table for holding a workpiece thereon, a laser beam applying unit for applying a laser beam to the workpiece held on the chuck table, an image capturing unit for producing a captured image of the workpiece that includes a captured image of light emitted from the workpiece when the laser beam is applied to the workpiece by the laser beam applying unit, and a control unit. The laser beam applying unit includes a laser oscillator for emitting a laser beam and a condensing lens for converging the laser beam emitted from the laser oscillator onto the workpiece. The control unit includes a determining section for determining a state of the laser beam applied to the workpiece, on the basis of the shape of the captured image of the light that is included in the captured image of the workpiece.

Preferably, the control unit further includes a storage section for storing a reference image produced by the image capturing unit through capturing of light emitted from the workpiece when the laser beam is applied under a predetermined condition to the workpiece by the laser beam applying unit, and a comparing section for comparing the captured image of the light with the reference image stored in the storage section. The determining section determines a state of the laser beam on the basis of the result of the comparison between the captured image of the light and the reference image from the comparing section.

Preferably, the laser beam applying unit further includes an attenuator disposed between the laser oscillator and the condensing lens and used for adjusting the output power of the laser beam emitted from the laser oscillator, the determining section assesses the output power of the laser beam applied to the workpiece, and the control unit controls the attenuator to adjust the output power of the laser beam by referring to the result of the assessment of the laser beam by the determining section.

Preferably, the laser beam applying unit further includes a dichroic mirror for transmitting therethrough the laser beam emitted from the laser oscillator to the condensing lens and reflecting wavelengths other than a wavelength of the laser beam. The captured image of the light is produced by the image capturing unit when the laser beam emitted from the laser oscillator is propagated via the condensing lens and the dichroic mirror and applied to the workpiece by the laser beam applying unit, causing the workpiece to emit light that is transmitted through the condensing lens and reflected by the dichroic mirror to the image capturing unit.

Preferably, the determining section determines whether or not an optical system of the laser beam applying unit is malfunctioning, depending on whether or not the shape of the captured image of the light included in the captured image of the workpiece is abnormally deformed, and assesses the output power of the laser beam on the basis of the size of the captured image of the light included in the captured image of the workpiece.

The laser processing apparatus according to the aspect of the present invention includes the image capturing unit that produces a captured image of the workpiece that includes a captured image of light emitted from the workpiece when the laser beam is applied to the workpiece by the laser beam applying unit. The shape of the captured image of the light emitted from the workpiece reflects the state of the laser beam. Therefore, the determining section of the control unit can determine the state of the laser beam on the basis of the shape of the captured image of the light included in the captured image of the workpiece. The determining section can detect a defect or malfunction that may occur inside or outside of the laser beam applying unit. The laser processing apparatus does not need to interrupt its step of processing the workpiece with the laser beam for detecting a defect or malfunction.

According to the aspect of the present invention, therefore, there is provided a laser processing apparatus capable of monitoring the state of a laser beam applied to a workpiece.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A laser processing apparatus according to an embodiment of the present invention will be described hereinbelow with reference to the accompanying drawings.

Figure 1:
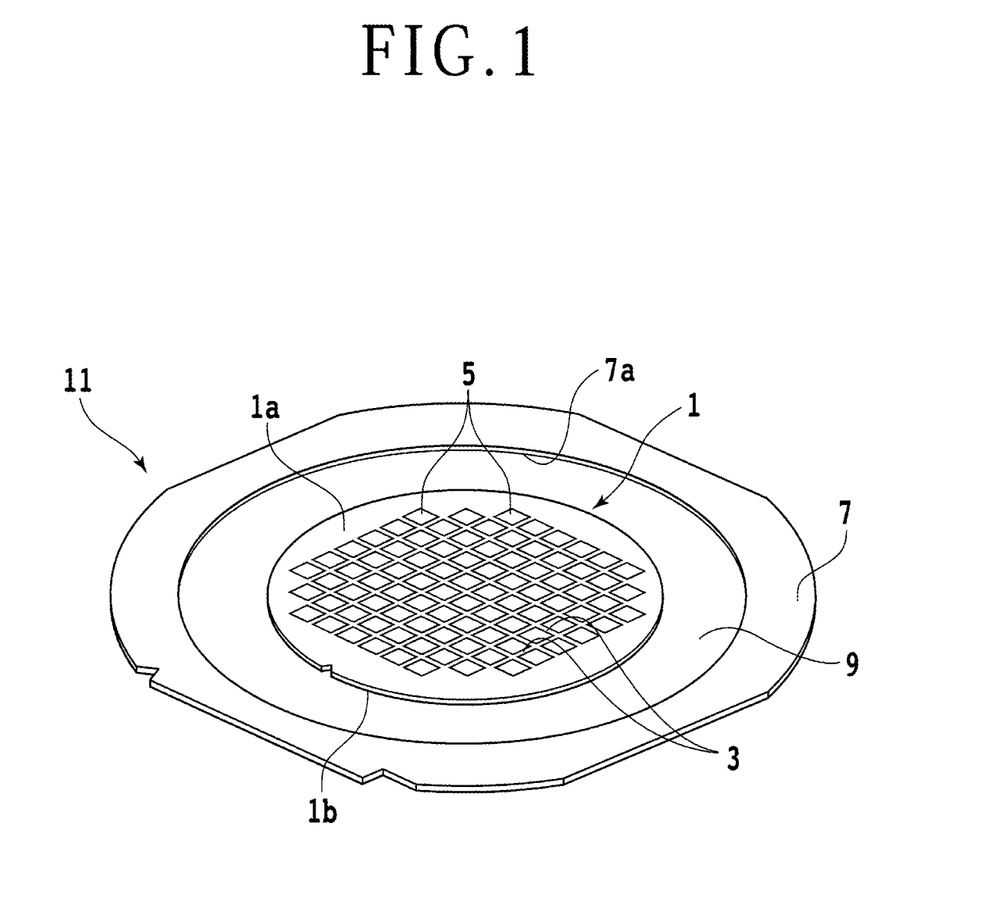
FIG. 1 is a perspective view schematically illustrating a workpiece by way of example.

First, a workpiece to be processed by the laser processing apparatus according to the present embodiment will be described below. The workpiece is, for example, a disk-shaped wafer made of silicon (Si), silicon carbide (SiC), gallium nitride (GaN), gallium arsenide (GaAs), or a material such as a semiconductor. Alternatively, the workpiece may be, for example, a substantially disk-shaped substrate made of a material such as sapphire, glass, or quartz. The glass may be, for example, alkali glass, non-alkali glass, soda-lime glass, lead glass, borosilicate glass, quartz glass, or the like. The workpiece may further alternatively be a packaged substrate, a ceramic substrate, or the like. Hereinafter, the workpiece will be described as a disk-shaped wafer by way of example, though not necessarily limited thereto. FIG. 1 schematically illustrates, in perspective, a frame unit 11 including the workpiece, which is denoted by 1, to be processed by the laser processing apparatus according to the present embodiment. As illustrated in FIG. 1, the workpiece 1 has a face side 1a including a plurality of areas demarcated by a grid of projected dicing lines 3 thereon. Devices 5 such as ICs or LSI circuits are formed in the respective areas demarcated on the face side 1a of the workpiece 1 by the projected dicing lines 3. The laser processing apparatus according to the present embodiment processes the workpiece 1 with a laser beam along the projected dicing lines 3, forming dividing grooves in the workpiece 1 along the projected dicing lines 3. The workpiece 1 is then divided along the dividing grooves into individual device chips including the respective devices 5.

The workpiece 1 such as a wafer that is being supported on an annular frame 7 through a dicing tape 9 is introduced into the laser processing apparatus. Specifically, before the workpiece 1 is introduced into the laser processing apparatus, the workpiece 1, the annular frame 7, and the dicing tape 9 are integrally combined with other, jointly forming the frame unit 11. The frame unit 11 includes the annular frame 7 having a central opening 7a therein, the dicing tape 9 disposed on the annular frame 7 so as to cover the central opening 7a, and the workpiece 1 affixed to the dicing tape 9 within the central opening 7a. When the individual device chips are divided from the workpiece 1, they are supported on the dicing tape 9. Thereafter, the dicing tape 9 are expanded along its plane, spreading the gaps between the device chips to allow the device chips to be picked up easily.

The annular frame 7 is made of material such as metal, for example, and has the central opening 7a that is larger in diameter than the workpiece 1. For forming the frame unit 11, the workpiece 1 is positioned and housed within the central opening 7a of the annular frame 7. The dicing tape 9 has a diameter larger than the diameter of the central opening 7a of the annular frame 7. The dicing tape 9 includes a base layer and an adhesive layer deposited on the base layer. The dicing tape 9 is affixed to the annular frame 7 and a reverse side 1b of the workpiece 1 by adhesive forces developed by the adhesive layer. When the dicing tape 9 is affixed to the reverse side 1b of the workpiece 1 as the reverse side 1b faces downwardly, the face side 1a of the workpiece 1 is exposed upwardly. Alternatively, the dicing tape 9 may be affixed to the face side 1a as the face side 1a faces downwardly, exposing the reverse side 1b upwardly.

Figure 2:
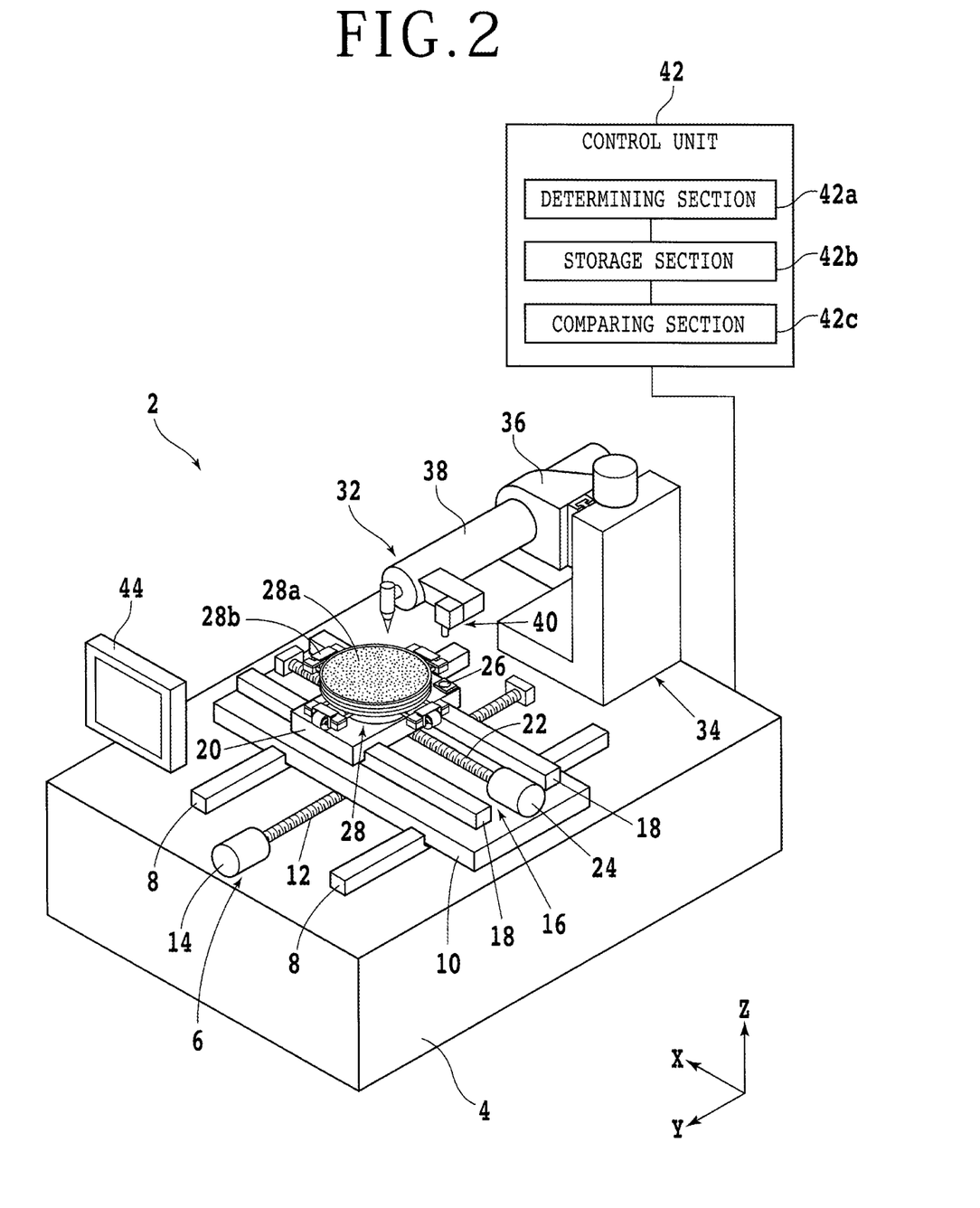
FIG. 2 is a perspective view schematically illustrating a laser processing apparatus according to an embodiment of the present invention.

Next, the laser processing apparatus according to the present embodiment which processes, with a laser beam, the workpiece 1 such as a wafer included in the frame unit 11 will be described below. FIG. 2 schematically illustrates, in perspective, the laser processing apparatus, which is denoted by 2, according to the present embodiment. The laser processing apparatus 2 includes a base 4 supporting thereon various components of the laser processing apparatus 2. The laser processing apparatus 2 includes a chuck table 28 for holding the workpiece 1 thereon, the chuck table 28 being disposed on an upper surface of the base 4. The laser processing apparatus 2 also includes a laser beam applying unit 32 for applying a laser beam to the workpiece 1 held on the chuck table 28, the laser beam applying unit 32 being disposed in overhanging relation to the chuck table 28. The base 4 supports, on its upper surface, a Y-axis moving unit 6 for moving the chuck table 28 and the laser beam applying unit 32 relatively to each other in Y-axis directions and an X-axis moving unit 16 for moving the chuck table 28 and the laser beam applying unit 32 relatively to each other in X-axis directions perpendicular to the Y-axis directions.

The Y-axis moving unit 6 includes a pair of Y-axis guide rails 8 extending along the Y-axis directions on the upper surface of the base 4 and a Y-axis movable table 10 slidably mounted on the Y-axis guide rails 8. The Y-axis movable table 10 has a nut (not illustrated) mounted on a lower reverse surface thereof and operatively threaded over a Y-axis ball screw 12 extending generally parallel to the Y-axis guide rails 8. The Y-axis ball screw 12 has an end coupled to a Y-axis stepping motor 14. When the Y-axis stepping motor 14 is energized, it rotates the Y-axis ball screw 12 about its central axis, causing the nut to move the Y-axis movable table 10 in one of the Y-axis directions along the Y-axis guide rails 8.

The X-axis moving unit 16 includes a pair of X-axis guide rails 18 that extend along the X-axis directions and that are disposed on the upper surface of the Y-axis movable table 10 and an X-axis movable table 20 slidably mounted on the X-axis guide rails 18. The X-axis movable table 20 has a nut (not illustrated) mounted on a lower reverse surface thereof and operatively threaded over an X-axis ball screw 22 extending generally parallel to the X-axis guide rails 18. The X-axis ball screw 22 has an end coupled to an X-axis stepping motor 24. When the X-axis stepping motor 24 is energized, it rotates the X-axis ball screw 22 about its central axis, causing the nut to move the X-axis movable table 20 in one of the X-axis directions along the X-axis guide rails 18. The X-axis movable table 20 supports, on its upper surface, a power meter 26 for measuring the output power of the laser beam emitted from the laser beam applying unit 32 and a chuck table 28 for holding the workpiece 1 thereon.

The chuck table 28 includes a porous member exposed upwardly, a suction channel having an end connected to the porous member, and a suction source connected to the other end of the suction channel. When the suction source is actuated, it develops a negative pressure acting through the suction channel on the porous member, holding the workpiece 1 under suction on the chuck table 28. The chuck table 28 has an upper surface acting as a holding surface 28a for holding the workpiece 1 under suction thereon. A plurality of clamps 28b for gripping the annular frame 7 of the frame unit 11 including the workpiece 1 are disposed around the chuck table 28.

The laser beam applying unit 32 is disposed above the chuck table 28 and is used for processing, with the laser beam, the workpiece 1 held under suction on the chuck table 28. The laser beam applying unit 32 processes the workpiece 1 with the laser beam (by way of ablation) by focusing the laser beam, which has a wavelength absorbable by the workpiece 1, within the workpiece 1 on the chuck table 28. While the laser beam applying unit 32 is converging the laser beam onto the face side 1a of the workpiece 1 in alignment with one of the projected dicing lines 3, the chuck table 28 and the laser beam applying unit 32 are moved relatively to each other in a direction parallel to the holding surface 28a along one of the projected dicing lines 3. The laser beam emitted from the laser beam applying unit 32 is thus applied to the workpiece 1 along the projected dicing line 3, forming dividing grooves in the workpiece 1 along the projected dicing line 3 to thereby divide the workpiece 1 along the projected dicing line 3.

A Z-axis moving unit 34 for moving the laser beam applying unit 32 in Z-axis directions perpendicular to the X-axis and Y-axis directions is mounted on the base 4 behind the Y-axis moving unit 6, the X-axis moving unit 16, and the chuck table 28. The Z-axis moving unit 34 is supported on the laser beam applying unit 32. The Z-axis moving unit 34 is, for example, a ball-screw-type moving mechanism having a structure similar to the Y-axis moving unit 6 and the X-axis moving unit 16, and moves a lifting and lowering body 36 vertically along the Z-axis directions. An arm 38 that hangs over the chuck table 28 is connected to the lifting and lowering body 36. The laser beam applying unit 32 is fixed to a distal end of the arm 38. A camera 40 for capturing images of the upper surface (face side 1a) of the workpiece 1 held on the chuck table 28 is disposed on the distal end of the arm 38 at a position adjacent to the laser beam applying unit 32 on the distal end of the arm 38. The camera 40 includes an image sensor such as a charge-coupled device (CCD) sensor or a complementary metal-oxide-semiconductor (CMOS) sensor and produces a captured image by capturing light that has reached the camera 40. The position of any one of the projected dicing lines 3 on the workpiece 1 can be specified on the basis of an image of the upper surface of the workpiece 1 captured by the camera 40. The camera 40 can also be used to confirm the result of a processing operation performed on the workpiece 1 by the laser beam applying unit 32.

Further, the laser processing apparatus 2 includes a control unit 42 for controlling the components thereof. The control unit 42 includes a computer including a processor such as a central processing unit (CPU), a main storage device such as a dynamic random access memory (DRAM), and an auxiliary storage device such as a flash memory. When the processor, etc., is operated according to software stored in the auxiliary storage device, the control unit 42 functions as specific means where the software and the processor (hardware resources) cooperate with each other. For processing the workpiece 1 along the projected dicing lines 3, the control unit 42 controls the Y-axis moving unit 6 and the X-axis moving unit 16 to move the chuck table 28 with respect to the laser beam applying unit 32 in directions parallel to the holding surface 28a. Specifically, the control unit 42 moves the converged spot of the laser beam relatively to the workpiece 1 along the projected dicing lines 3. While moving the converged spot of the laser beam relatively to the workpiece 1, the control unit 42 controls the laser beam applying unit 32 to apply the laser beam to the workpiece 1 to thereby process the workpiece 1 with the laser beam along the projected dicing lines 3.

Note that, in the laser processing apparatus 2, one of or both the Y-axis moving unit 6 and the X-axis moving unit 16 may move the laser beam applying unit 32 with respect to the chuck table 28, instead of moving the chuck table 28 with respect to the laser beam applying unit 32. Further, in the case where the laser beam applying unit 32 incorporates a mechanism for adjusting the height of the converged spot of the laser beam by lifting or lowering a condensing lens of the laser beam applying unit 32, for example, the laser processing apparatus 2 may be free of the Z-axis moving unit 34. The laser processing apparatus 2 further includes a display unit 44 for displaying various pieces of information including its operation state, warning information, etc. The display unit 44 is a liquid crystal display, for example. The laser processing apparatus 2 may include a touch panel functioning as an input interface through which an operator can enter various commands. The display unit 44 may be a display with a touch panel, for example.

Figure 3:
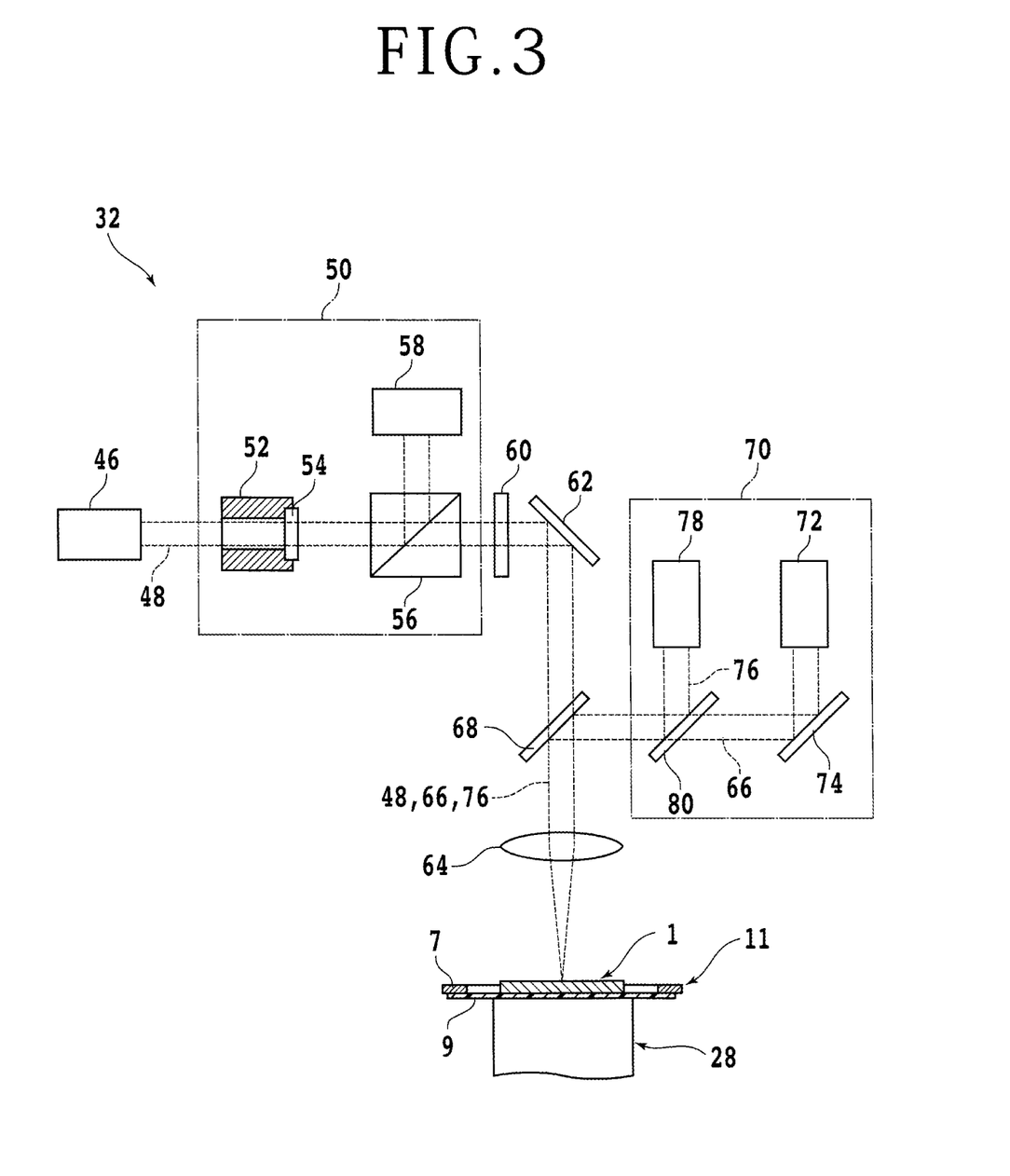
FIG. 3 is a side elevational view schematically illustrating an optical system of a laser beam applying unit of the laser processing apparatus.

Next, the laser beam applying unit 32 will be described in detail below. FIG. 3 schematically illustrates, in side elevation, an optical system of the laser beam applying unit 32. In FIG. 3, some components of the optical system are illustrated in cross section, and various casings are omitted from illustration. The components of the laser beam applying unit 32 may appropriately be changed in layout. The laser beam applying unit 32 includes a laser oscillator 46 for emitting a laser beam 48. The laser oscillator 46 has a medium of Nd:YAG, Nd:YVO$_4$, or the like, for example, and can emit the laser beam 48 that has a wavelength absorbable by the workpiece 1. The laser beam applying unit 32 also has an output adjusting unit (attenuator) 50 for adjusting the output power of the laser beam 48 emitted from the laser oscillator 46. The output adjusting unit 50 includes a half-wave plate 54 rotatably supported by a hollow motor 52 and a beam splitter 56 for reflecting an S-polarized component of the laser beam 48 and transmitting a P-polarized component of the laser beam 48 therethrough. The output adjusting unit 50 also includes a beam damper 58 for absorbing the S-polarized component of the laser beam 48 reflected by the beam splitter 56.

The laser beam 48 that has arrived at the output adjusting unit 50 travels in the hollow motor 52 and passes through the half-wave plate 54 as it is rotated by the hollow motor 52. At this time, the laser beam 48 is rotated by the half-wave plate 54, changing the ratio between the P-polarized component and S-polarized component of the laser beam 48 as it reaches the beam splitter 56. The output adjusting unit 50 adjusts the intensity of the P-polarized component of the laser beam 48 that reaches the beam splitter 56, when the hollow motor 52 rotates the half-wave plate 54. Therefore, when the half-wave plate 54 is rotated, the output adjusting unit 50 adjusts the intensity of the P-polarized component of the laser beam 48 that is transmitted through the beam splitter 56, i.e., adjusts the output power of the laser beam 48 as it is emitted from the output adjusting unit 50. The output adjusting unit 50 is not limited to the illustrated details and may have different structural details.

The laser beam applying unit 32 includes a mask 60 having a beam transmission window for shaping, into a predetermined shape, the laser beam 48 whose output power has been adjusted by the output adjusting unit 50. However, the laser beam applying unit 32 may shape the laser beam 48 with different means instead of the mask 60. Further, the laser beam applying unit 32 includes a mirror 62 for reflecting the laser beam 48 shaped by the mask 60 toward the chuck table 28 and a condensing lens 64 for converging the laser beam 48 reflected by the mirror 62 onto the upper surface of the workpiece 1 held on the chuck table 28. The laser beam 48 has its converged spot positioned on the upper surface, i.e., the face side 1a, of the workpiece 1 on the chuck table 28. The height of the converged spot may be adjusted by the Z-axis moving unit 34. Alternatively, the height of the converged spot may be adjusted by different means instead of the Z-axis moving unit 34.

For processing the workpiece 1 with the laser beam on the laser processing apparatus 2, first, the chuck table 28 holds the frame unit 11 thereon, and the camera 40 observes, i.e., captures an image of, the face side 1a of the workpiece 1 to detect the position and direction of one of the projected dicing lines 3 on the face side 1a of the workpiece 1. Thereafter, the chuck table 28 is rotated about an axis perpendicular to the holding surface 28a to orient the projected dicing line 3 into alignment with the X-axis directions or the Y-axis directions. Next, the Y-axis moving unit 6 and the X-axis moving unit 16 are actuated to position an end of the projected dicing line 3 below the laser beam applying unit 32. Thereafter, the laser oscillator 46 is energized to emit and converge the laser beam 48 onto the face side 1a of the workpiece 1, and the Y-axis moving unit 6 or the X-axis moving unit 16 is actuated to processing-feed the workpiece 1 with respect to the laser beam applying unit 32. The laser beam 48 thus processes the workpiece 1 (by way of ablation) along the projected dicing line 3, forming a dividing groove in the workpiece 1 along the projected dicing line 3.

After the workpiece 1 has been processed by way of ablation along the projected dicing line 3, the Y-axis moving unit 6 or the X-axis moving unit 16 is actuated to indexing-feed the workpiece 1 with respect to the laser beam applying unit 32, and the laser beam 48 similarly processes the workpiece 1 by way of ablation along a next projected dicing line 3, forming a dividing groove in the workpiece 1 along the next projected dicing line 3. In this manner, the laser processing apparatus 2 processes the workpiece 1 with the laser beam 48 along the projected dicing lines 3 that extend in a first direction. Thereafter, the chuck table 28 is rotated, or the Y-axis moving unit 6 and the X-axis moving unit 16 are switched around in function. Then, the laser processing apparatus 2 similarly processes the workpiece 1 with the laser beam 48 along the projected dicing lines 3 that extend in a second direction that extends perpendicularly to the first direction. When the workpiece 1 has been processed along all the projected dicing lines 3 on the face side 1a by the laser beam 48, the workpiece 1 is divided by the dividing grooves, producing individual device chips.

For processing a plurality of workpieces 1 uniformly with the laser beam on the laser processing apparatus 2, it is necessary to apply the laser beam 48 to the workpieces 1 under uniform conditions. However, while the workpieces 1 are being processed by the laser beam 48, the laser beam 48 may vary in its state. For example, the laser oscillator 46 may become unstable in operation, causing a pointing shift or a change in the energy distribution of the laser beam 48. In addition, the laser beam 48 may have its output power changed, failing to irradiate the workpiece 1 with a required output power or irradiating the workpiece 1 with an excessive output power. In these situations, the workpieces 1 tend to suffer from processing failures.

According to one solution, the power meter 26 is used to monitor the output power of the laser beam 48 at periodic intervals. However, for measuring the output power of the laser beam 48 with the power meter 26, it is necessary to interrupt the processing of the workpiece 1 with the laser beam 48 and apply the laser beam 48 to the power meter 26. In other words, since the workpiece 1 cannot be processed by the laser beam 48 while the output power of the laser beam 48 is being measured by the power meter 26, the efficiency with which to process the workpiece 1 on the laser processing apparatus 2 is lowered. Further, minute dust particles produced in the output adjusting unit 50 when the hollow motor 52 rotates the half-wave plate 54 and grease or the like used in the hollow motor 52 may be stirred up, and at least some of them may be introduced into the optical path in the output adjusting unit 50. In addition, the mask 60 may suffer a positional change within a plane perpendicular to the optical path, tending to fail to shape the laser beam 48 into an appropriate shape. Another possibility is that swarf produced from the workpiece 1 at the time it is processed by the laser beam 48 may be deposited on the outer surface of the condensing lens 64, preventing the condensing lens 64 from applying the laser beam 48 properly to the workpiece 1.

In the event of these situations, the laser beam 48 may partly be blocked or dispersed by foreign matter and changed in configuration. Stated otherwise, the optical system may malfunction, failing to converge the laser beam 48 properly onto the workpiece 1 and hence to process the workpiece 1 appropriately with the laser beam 48. Therefore, the laser beam 48 may not be applied in a predetermined state to the workpiece 1 and hence may not process the workpiece 1 appropriately. According to the present embodiment, the laser processing apparatus 2 captures an image including a light spot developed by the laser beam 48 applied to the workpiece 1 and monitors the state of the laser beam 48 on the basis of the shape of the light spot in the captured image. Since the position and shape of the light spot included in the captured image reflect the state of the laser beam 48, the laser processing apparatus 2 can determine the state of the laser beam 48 from the position and shape of the light spot. When the state of the laser beam 48 is determined on the basis of the light spot in the captured image, it is not necessary to interrupt the processing of the workpiece 1 with the laser beam. The laser processing apparatus 2 according to the present invention will further be described below mainly with regard to means for contributing to the monitoring of the state of the laser beam 48.

When the laser beam 48 is applied to the workpiece 1, part of the workpiece 1 is turned into a plasma, giving off light 66. The light 66 emitted from the workpiece 1 reaches the condensing lens 64 and travels in the laser beam applying unit 32. The laser processing apparatus 2 according to the present embodiment includes a mechanism for capturing an image of the light 66. Specifically, the laser beam applying unit 32 includes a dichroic mirror 68 disposed between the mirror 62 and the condensing lens 64. The dichroic mirror 68 transmits and guides the laser beam 48 emitted from the laser oscillator 46 therethrough to the condensing lens 64, and reflects wavelengths other than the wavelength of the laser beam 48. The dichroic mirror 68 reflects the light 66 produced from the workpiece 1 by the laser beam 48, toward an image capturing unit 70 to be described below. In other words, the light 66 is produced when the laser beam 48 propagated via the condensing lens 64 and the dichroic mirror 68 is applied to the workpiece 1, passes through the condensing lens 64, and is reflected by the dichroic mirror 68 to reach the image capturing unit 70.

The image capturing unit 70 captures the light 66 that is produced from the workpiece 1 when the laser beam 48 is applied to the workpiece 1. The image capturing unit 70 includes a mirror 74 for reflecting the light 66 reflected by the dichroic mirror 68 toward an image capturing device 72. The image capturing device 72 is, for example, a CCD sensor, a CMOS sensor, or the like. The image capturing unit 70 is electrically connected to the control unit 42 and sends a captured image including an image of the light 66 to the control unit 42.

Further, the image capturing unit 70 may apply illuminating light to the face side 1a of the workpiece 1 on the chuck table 28. For example, the image capturing unit 70 may further include a half-silvered mirror 80 disposed between the dichroic mirror 68 and the mirror 74, and an illuminating light source 78. The illuminating light source 78 is a xenon lamp, for example. The illuminating light source 78 emits illuminating light 76. The illuminating light 76 is reflected by the half-silvered mirror 80 toward the dichroic mirror 68 and is then reflected by the dichroic mirror 68 through the condensing lens 64 toward the face side 1a of the workpiece 1. When the illuminating light 76 is applied to the face side 1a of the workpiece 1, the image capturing unit 70 captures an image of the face side 1a of the workpiece 1 that also includes the image of the light 66. In such a case, since the captured image of the face side 1a of the workpiece 1 allows the operator to confirm an area where the face side 1a is irradiated with the laser beam 48 (also referred to as "irradiated area"), the operator can determine whether or not the position at which the laser beam 48 is applied to the face side 1a is appropriate.

Figure 4:
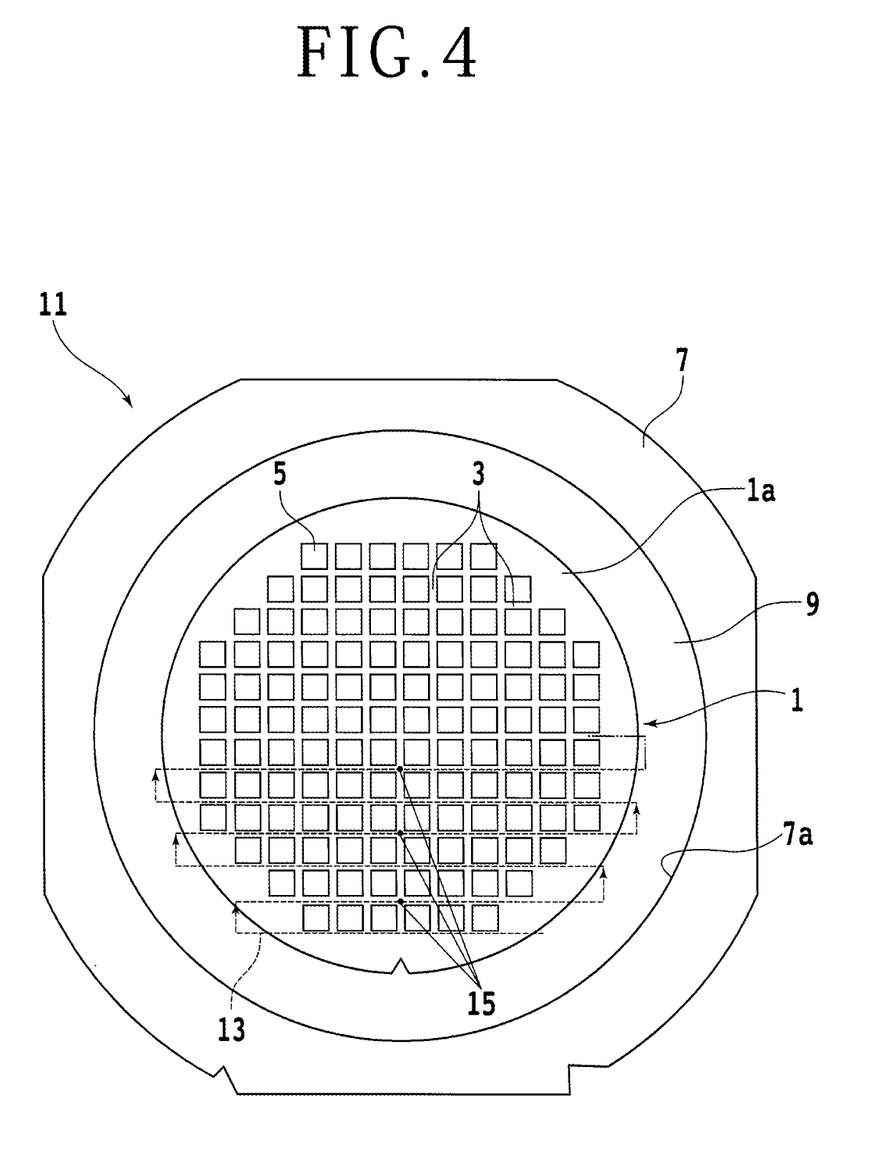
FIG. 4 is a plan view schematically illustrating a path followed by a spot irradiated with a laser beam on the workpiece.

Note that the captured image produced by the image capturing unit 70 may repetitively be acquired by the control unit 42 uninterruptedly while the laser processing apparatus 2 is processing the workpiece 1 with the laser beam 48. In such a case, the captured image repetitively acquired by the control unit 42 uninterruptedly makes it possible to immediately detect a change in the state of the laser beam 48 when such a change occurs; however, it tends to impose an excessive load on the control unit 42 in determining the state of the laser beam 48. If abrupt changes in the state of the laser beam 48 are not anticipated, then it is sufficient for the control unit 42 to acquire captured images at certain intervals. FIG. 4 schematically illustrates, in plan, a path 13 followed by a spot irradiated with the laser beam 48 on the face side 1a of the workpiece 1. Inasmuch as the laser beam 48 is continuously converged onto the face side 1a of the workpiece 1 along successive projected dicing lines 3, the irradiated spot moves along the path 13 along the successive projected dicing lines 3. For example, when the irradiated spot reaches an imaging position 15 on one of those projected dicing lines 3, the image capturing unit 70 is energized to capture an image of the face side 1a of the workpiece 1, and the control unit 42 acquires the captured image from the image capturing unit 70. As the irradiated spot reaches imaging positions 15, one at a time, on the respective projected dicing lines 3, the image capturing unit 70 captures respective images, one at a time, of the face side 1a. Accordingly, the control unit 42 undergoes a reduced load in acquiring captured images as it is not required to perform uninterrupted captured image acquisition.

The state of the laser beam 48 is determined by the control unit 42 of the laser processing apparatus 2 on the basis of the captured images produced by the image capturing unit 70. As illustrated in FIG. 1, the control unit 42 includes a determining section 42a for determining the state of the laser beam 48 applied to the workpiece 1, on the basis of the shape of a captured image of the light 66 included in the captured image. Next, a step of determining the state of the laser beam 48 that is carried out by the determining section 42a will be described below. FIGS. 5A through 5D schematically illustrate, in plan, captured images 17a, 17b, 17c, and 17d, respectively, of the face side 1a of the workpiece 1 at the time the laser beam 48 is applied thereto. As illustrated in FIGS. 5A through 5D, the captured images 17a, 17b, 17c, and 17d include respective captured images 19a, 19b, 19c, and 19d of the light 66 produced from the workpiece 1 when the laser beam 48 is applied to the workpiece 1 at different output power levels.

The laser beam 48 emitted from the laser oscillator 46 is shaped into the predetermined shape by the mask 60 before it is applied to the workpiece 1. Specifically, as illustrated in FIGS. 5A through 5D, the laser beam 48 is shaped into an elliptical cross-sectional shape, which is somewhat close to an oblong rectangular shape, in a plane perpendicular to the optical axis of the laser beam 48, for example. The area irradiated with the laser beam 48 on the face side 1a of the workpiece 1 is of an elliptical shape whose minor axis is aligned with the direction of the projected dicing line 3 (processing feed direction) and whose major axis is aligned with the widthwise directions of the projected dicing line 3. When the laser beam 48 thus shaped is applied to the workpiece 1, the light 66 given off by the workpiece 1 reflects the elliptical shape of the irradiated area on the face side 1a. Therefore, the captured images 19a, 19b, 19c, and 19*d* of the light 66 included in the respective captured images 17*a*, 17*b*, 17*c*, and 17*d* are also of an elliptical shape.

Figure 5A:
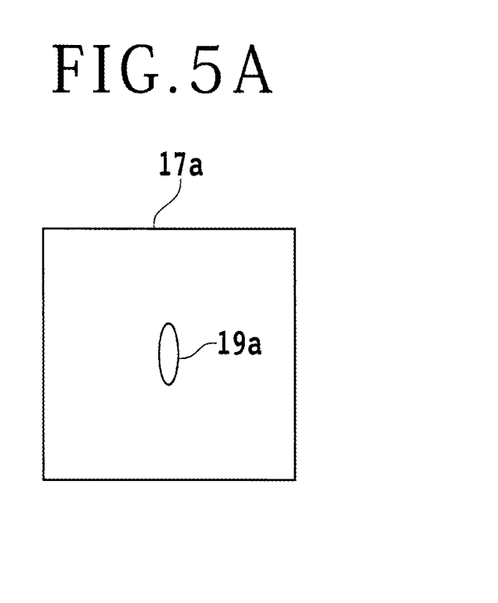
FIGS. 5A through 5D are plan views schematically illustrating captured images of light from the laser beam applied to the workpiece.
Figure 5B:
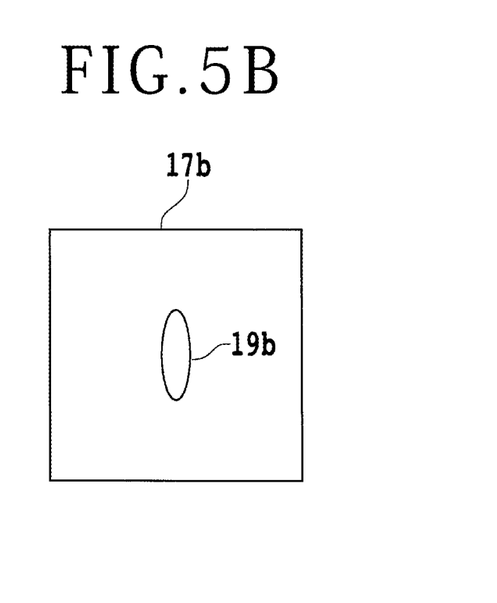
Figure 5C:
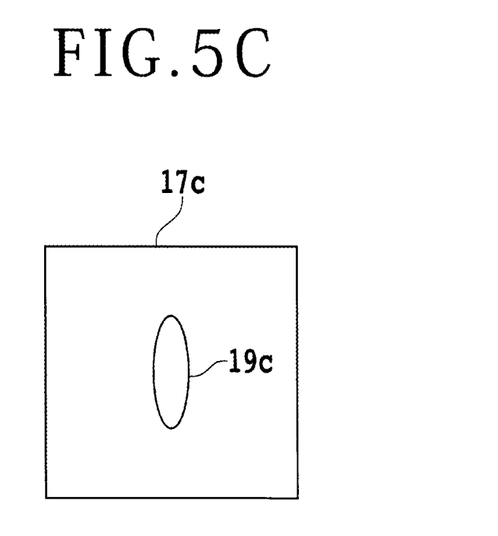
Figure 5D:
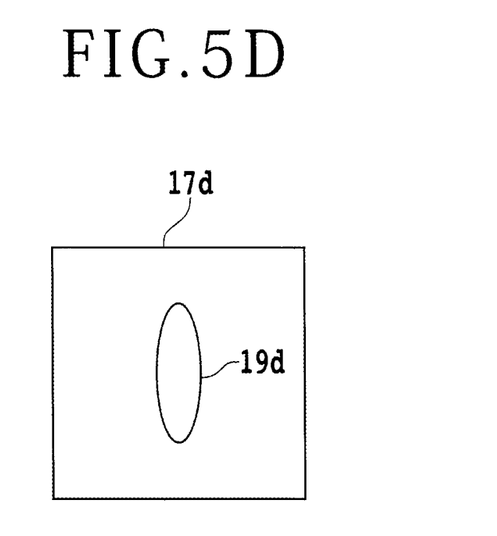

As illustrated in FIGS. 5A and 5B, the output power of the laser beam 48 that is applied to the workpiece 1 when the captured image 17*b* including the captured image 19*b* of the light 66 is acquired as illustrated in FIG. 5B is larger than the output power of the laser beam 48 that is applied to the workpiece 1 when the captured image 17*a* including the captured image 19*a* of the light 66 is acquired as illustrated in FIG. 5A. As illustrated in FIGS. 5B and 5C, the output power of the laser beam 48 that is applied to the workpiece 1 when the captured image 17*c* including the captured image 19*c* of the light 66 is acquired as illustrated in FIG. 5C is larger than the output power of the laser beam 48 that is applied to the workpiece 1 when the captured image 17*b* including the captured image 19*b* of the light 66 is acquired as illustrated in FIG. 5B. Further, as illustrated in FIGS. 5C and 5D, the output power of the laser beam 48 that is applied to the workpiece 1 when the captured image 17*d* including the captured image 19*d* of the light 66 is acquired as illustrated in FIG. 5D is larger than the output power of the laser beam 48 that is applied to the workpiece 1 when the captured image 17*c* including the captured image 19*c* of the light 66 is acquired as illustrated in FIG. 5C. The sizes of the captured images 19*a*, 19*b*, 19*c*, and 19*d* of the light 66 included in the respective captured images 17*a*, 17*b*, 17*c*, and 17*d* are determined by the respective output power levels of the laser beam 48 that has contributed to the emission of the light 66, and are larger as the output power levels of the laser beam 48 are larger. Therefore, it is possible to assess the output power levels of the laser beam 48 from the sizes of the captured images 19*a*, 19*b*, 19*c*, and 19*d* of the light 66. The determining section 42*a* of the control unit 42 can assess the output power levels of the laser beam 48 from the sizes of the captured images 19*a*, 19*b*, 19*c*, and 19*d* produced by the image capturing unit 70.

The output power of the laser beam 48 can be adjusted by the output adjusting unit (attenuator) 50. The control unit 42 may control the output adjusting unit (attenuator) 50 to adjust the output power of the laser beam 48 by referring to the output power level of the laser beam 48 that is assessed by the determining section 42*a*. In this case, the laser processing apparatus 2 can monitor the output power of the laser beam 48 while the workpiece 1 is being processed by the laser beam 48, and hence can immediately correct an output power level of the laser beam 48 in the case where the output power level deviates from a predetermined level beyond an allowable margin.

Figure 6A:
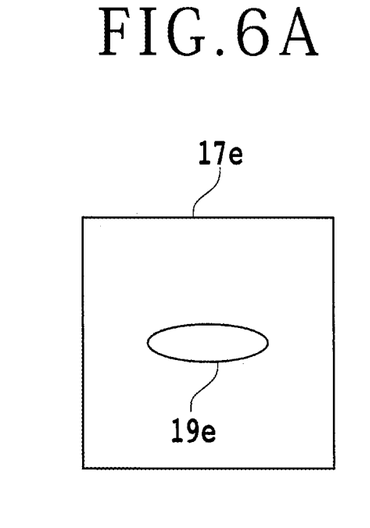
FIGS. 6A through 6C are plan views schematically illustrating captured images of light from the laser beam applied to the workpiece.
Figure 6B:
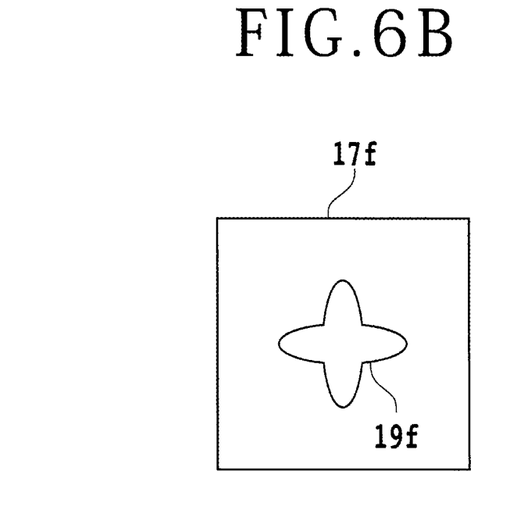
Figure 6C:
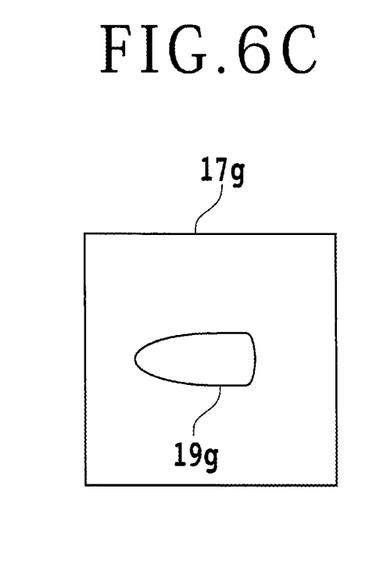

Further, the determining section 42*a* of the control unit 42 may determine a state of something other than the output power of the laser beam 48 on the basis of captured images produced by the image capturing unit 70. For example, the determining section 42*a* may determine whether or not the optical system of the laser beam applying unit 32 is malfunctioning. FIGS. 6A through 6C schematically illustrate, in plan, captured images 17*e*, 17*f*, and 17*g* produced by the image capturing unit 70 in the case where the optical system is malfunctioning due to entry of foreign matter into the optical system. As illustrated in FIGS. 6A through 6C, when optical system is malfunctioning, the laser beam 48 is applied to the workpiece 1 in distorted cross-sectional shapes. Therefore, the face side 1*a* of the workpiece 1 emits light 66 in distorted shapes. The captured images 17*e*, 17*f*, and 17*g* thus include abnormally deformed captured images 19*e*, 19*f*, and 19*g* of the light 66. Consequently, it is possible to determine whether or not the optical system is malfunctioning, on the basis of whether or not the captured image of the light 66 included in the captured image of the face side 1*a* is abnormally deformed. As a result, the determining section 42*a* of the control unit 42 can determine whether or not the optical system for transmitting the laser beam 48 is malfunctioning, on the basis of whether or not the captured image of the light 66 included in the captured image of the face side 1*a* is abnormally deformed.

The laser beam applying unit 32 may incorporate therein a power meter for monitoring the state of the laser beam 48, for example. However, if a problem such as entry of foreign matter into the path of the laser beam 48 occurs outside of the laser beam applying unit 32, the power meter is unable to detect a resultant defect of the laser beam 48. In contrast, the laser processing apparatus 2 according to the present embodiment monitors the state of the laser beam 48 on the basis of the light 66 emitted from the workpiece 1 when the laser beam 48 is actually applied to the workpiece 1. Accordingly, it is possible to detect a defect of the laser beam 48 in the event of entry of foreign matter into the path of the laser beam 48 outside of the laser beam applying unit 32.

Note that the determining section 42*a* may determine whether or not the laser beam 48 is defective, by comparing a captured image produced by the image capturing unit 70 with reference images prepared in advance. In this case, the control unit 42 includes, as illustrated in FIG. 2, a storage section 42*b* for storing one or more reference images obtained by capturing light emitted from the workpiece 1 when the laser beam 48 is applied to the workpiece 1 under predetermined conditions. The control unit 42 also includes a comparing section 42*c* for comparing a captured image with the reference image or images stored in the storage section 42*b*. The determining section 42*a* determines whether or not the laser beam 48 is defective, on the basis of the result of the comparison drawn between the captured image and the reference image or images by the comparing section 42*c*. The storage section 42*b* registers, as the reference images, captured images produced by the image capturing unit 70 through capturing of the light 66 emitted from the workpiece 1 when the laser beam 48 in a predetermined state is applied to the workpiece 1. Particularly, it is preferable to apply the laser beam 48 to the workpiece 1 at different output power levels and to store, as reference images, captured images produced by the image capturing unit 70 through capturing of the light 66 emitted from the workpiece 1 in association with the respective output power levels of the laser beam 48 in the storage section 42*b*. With the reference images thus stored in the storage section 42*b*, the comparing section 42*c* can make comparisons using the reference images depending on the output power levels of the laser beam 48.

For example, the comparing section 42*c* processes a captured image of the face side 1*a* of the workpiece 1 that includes a captured image of the light 66 emitted from the workpiece 1 when the laser beam 48 is applied to the workpiece 1, and extracts the profile of a region where the captured image of the light 66 is included, thereby specifying the shape of the region. Further, the comparing section 42*c* selects the reference image corresponding to the output power level of the laser beam 48 applied to the workpiece 1, reads the selected reference image from the storage section 42*b*, and specifies the shape of the captured image of the light 66 included in the reference image in a similar fashion. Thereafter, the comparing section 42*c* compares the captured image produced by the image capturing unit 70 and the reference image with each other, and calculates the degree to which the region where the captured image of the light 66 is included agrees with the captured image of the light 66 included in the reference image. Then, if the degree to which the region where the captured image of the light 66 is included agrees with the captured image of the light 66 included in the reference image is equal to or larger than a predetermined threshold value, the determining section 42a determines that the state of the laser beam 48 is not defective, and if the degree to which the region where the captured image of the light 66 is included agrees with the captured image of the light 66 included in the reference image is smaller than the predetermined threshold value, the determining section 42a determines that the state of the laser beam 48 is defective.

Figure 7:
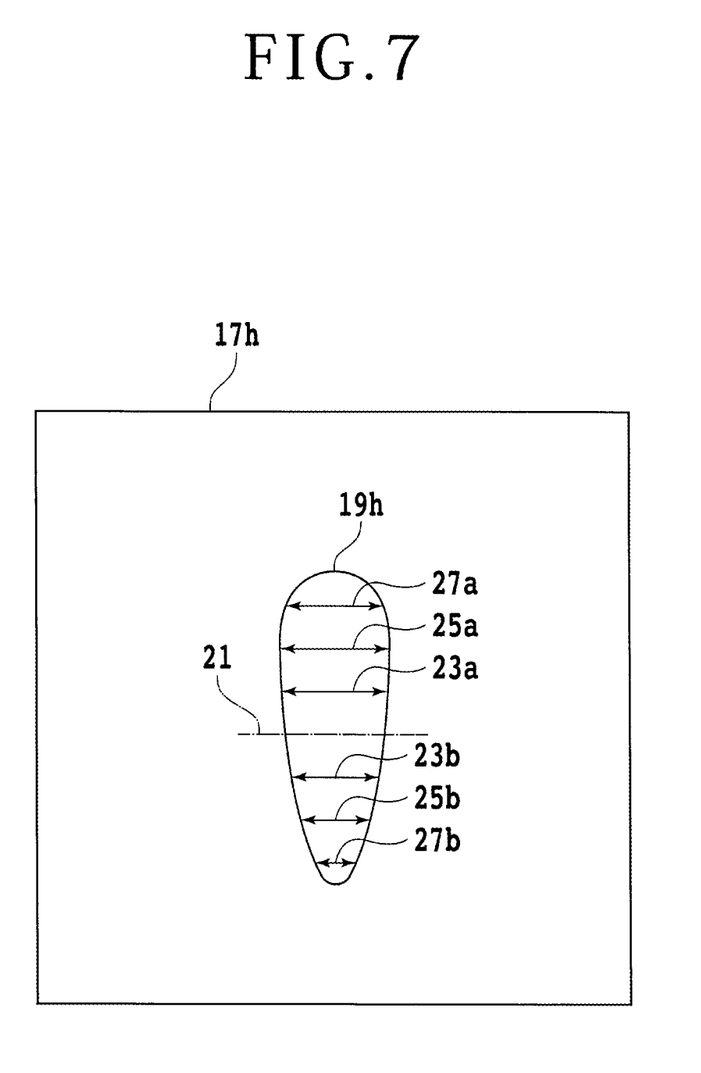
FIG. 7 is a plan view schematically illustrating a procedure for assessing a captured image of light included in a captured image of the workpiece.

However, the determining step carried out by the determining section 42a is not limited to the above step based on the result of the comparison made by the comparing section 42c. Further, the determining step carried out by the determining section 42a is not limited to the comparison between the captured image produced by the image capturing unit 70 and the reference image or images. Another determining step carried out by the determining section 42a will be described below. FIG. 7 schematically illustrates, in plan, a captured image 17h produced by the image capturing unit 70 through capturing of the face side 1a of the workpiece 1, the captured image 17h including a captured image 19h of the light 66 emitted from the workpiece 1 when the laser beam 48 is applied to the workpiece 1. As illustrated in FIG. 7, the captured image 19h of the light 66 included in the captured image 17h is of a distorted elliptical shape different from the shapes of the captured images 19a, 19b, 19c, and 19d of the light 66 illustrated in FIGS. 4A through 4D. A step of assessing the shape of the captured image 19h of the light 66 will be described below.

In the captured image 17h, there is established a central line 21 extending through the center of the spot of the face side 1a of the workpiece 1 irradiated with the laser beam 48 along the minor axis (horizontal in FIG. 7) of the captured image 19h. Then, different widths of the captured image 19h are measured at locations spaced at equal distances from the central line 21 along the major axis (vertical in FIG. 7) of the captured image 19h, and the differences between the widths at those locations are calculated and assessed. For example, providing the vertical length of the captured image 19h along the major axis thereof is in the range of 35 to 60 μm, the widths of the captured image 19h are measured at locations spaced approximately 5 to 10 μm from the central line 21.

For example, above the central line 21 as viewed in FIG. 7, a width 23a of the captured image 19h at a position near, i.e., slightly spaced from, the central line 21, a width 25a of the captured image 19h at a position further spaced from the central line 21, and a width 27a of the captured image 19h at a position still further spaced from the central line 21 are measured. In addition, below the central line 21 as viewed in FIG. 7, a width 23b of the captured image 19h at a position corresponding to the position of the width 23a across the central line 21, a width 25b of the captured image 19h at a position corresponding to the position of the width 25a across the central line 21, and a width 27b of the captured image 19h at a position corresponding to the position of the width 27a across the central line 21 are measured. Then, the difference between the width 23a and the width 23b, the difference between the width 25a and the width 25b, and the difference between the width 27a and the width 27b are calculated as the differences between the widths of the captured image 19h at the positions equally spaced from each other across the central line 21. Thereafter, it is determined whether or not the value of each of the differences exceeds a predetermined threshold value.

In the laser processing apparatus 2, the shape of the beam transmission window of the mask 60, the layout of the optical components, etc., are determined in order that the area of the face side 1a of the workpiece 1 irradiated with the laser beam 48 is of a predetermined elliptical shape. The predetermined threshold value may thus be established on the basis of the width of the planned irradiated area of the face side 1a of the workpiece 1. For example, the predetermined threshold value may be set to a value in the range of 15% to 25% of the width of the planned irradiated area at a central line thereof along the minor axis of the elliptical shape thereof, and may preferably be set to a value of approximately 20% of the width of the planned irradiated area along the central line thereof. For example, if the width of the planned irradiated area at the central line along the minor axis of the elliptical shape thereof is 10 μm, then the threshold value may be set to 2 μm. The determining section 42a determines that the state of the laser beam 48 is free of defects, if all of the values of the differences between the widths of the captured image 19h at the positions equally spaced from each other across the central line 21 are smaller than 2 μm. On the other hand, the determining section 42a determines that the state of the laser beam 48 is defective, if any of the values of the differences is equal to or larger than 2 μm. The predetermined threshold value may alternatively be set on the basis of width of the captured image of light emitted from the workpiece 1 at the central line along the minor axis thereof and included in the reference image or images. Further alternatively, the predetermined threshold value may be set on the basis of width of the captured image 19h at the central line 21 included in the captured image 17h.

In the event of a defect of the state of the laser beam 48 as determined according to the above determining step, one of the causes of the defect may possibly be a positional shift of the mask 60. Therefore, the operator may want to check adjustment screws by which the mask 60 is movably fixed in position, and re-adjust the mask 60 in position. For example, the control unit 42 may display the result of the determining step performed by the determining section 42a on the display unit 44, giving a visual indication of the result of the determining step to the user or administrator of the laser processing apparatus 2. In addition, in the event that the control unit 42 has detected an unavoidable processing failure on account of a determined defect of the state of the laser beam 48, the control unit 42 may immediately interrupt the processing of the workpiece 1 on the laser processing apparatus 2.

As described above, the laser processing apparatus according to the present embodiment determines the state of the laser beam 48 using light emitted from the workpiece 1 by a plasma that is produced by the workpiece 1 when the workpiece 1 is processed by the laser beam 48. Therefore, it is not necessary to stop the processing of the workpiece 1 with the laser beam 48 in order to determine the state of the laser beam 48.

The present invention is not limited to the embodiment described above, and many changes and modifications may be made in the embodiment. For example, the storage section 42b of the control unit 42 may store and accumulate captured images produced by the image capturing unit 70, as well as the reference image or images to be compared with those captured images. In such a case, in the event of a defect of the state of the laser beam 48 or a processing failure of the workpiece 1, the captured images stored in the storage section 42*b* can be used to identify the cause of the defect or the processing failure.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus comprising:
a chuck table for holding a workpiece thereon;
a laser beam applying unit for applying a laser beam to the workpiece held on the chuck table;
an image capturing sensor for producing a captured image of the workpiece that includes a captured image of light emitted from the workpiece when the laser beam is applied to the workpiece by the laser beam applying unit; and
a control unit, wherein
the laser beam applying unit includes:
a laser oscillator for emitting a laser beam, and
a condensing lens for converging the laser beam emitted from the laser oscillator onto the workpiece, and
the control unit includes a determining section for determining a state of the laser beam applied to the workpiece, on a basis of a shape of the captured image of the light that is included in the captured image of the workpiece, wherein
the laser beam applying unit further includes an attenuator disposed between the laser oscillator and the condensing lens and used for adjusting output power of the laser beam emitted from the laser oscillator,
the determining section assesses the output power of the laser beam applied to the workpiece, and
the control unit controls the attenuator to adjust the output power of the laser beam by referring to a result of the assessment of the laser beam by the determining section.

2. The laser processing apparatus according to claim 1, wherein
the control unit further includes
a storage section for storing a reference image produced by the image capturing sensor through capturing of light emitted from the workpiece when the laser beam is applied under a predetermined condition to the workpiece by the laser beam applying unit, and
a comparing section for comparing the captured image of the light with the reference image stored in the storage section, and
the determining section determines a state of the laser beam on a basis of a result of the comparison between the captured image of the light and the reference image from the comparing section.

3. A laser processing apparatus comprising:
a chuck table for holding a workpiece thereon;
a laser beam applying unit for applying a laser beam to the workpiece held on the chuck table;
an image capturing sensor for producing a captured image of the workpiece that includes a captured image of light emitted from the workpiece when the laser beam is applied to the workpiece by the laser beam applying unit; and
a control unit, wherein
the laser beam applying unit includes
a laser oscillator for emitting a laser beam, and
a condensing lens for converging the laser beam emitted from the laser oscillator onto the workpiece, and
the control unit includes a determining section for determining a state of the laser beam applied to the workpiece, on a basis of a shape of the captured image of the light that is included in the captured image of the workpiece, wherein
the laser beam applying unit further includes a dichroic mirror for transmitting therethrough the laser beam emitted from the laser oscillator to the condensing lens and reflecting wavelengths other than a wavelength of the laser beam, and
the captured image of the light is produced by the image capturing sensor when the laser beam emitted from the laser oscillator is propagated via the condensing lens and the dichroic mirror and applied to the workpiece by the laser beam applying unit, causing the workpiece to emit light that is transmitted through the condensing lens and reflected by the dichroic mirror to the image capturing sensor.

4. The laser processing apparatus according to claim 1, wherein
the determining section determines whether or not an optical system of the laser beam applying unit is malfunctioning, depending on whether or not the shape of the captured image of the light included in the captured image of the workpiece is abnormally deformed, and assesses output power of the laser beam on a basis of a size of the captured image of the light included in the captured image of the workpiece.

5. The laser processing apparatus according to claim 1, wherein the captured image produced by the image capturing unit is repetitively acquired by the control unit uninterruptedly while the laser processing apparatus is processing the workpiece with the laser beam.

6. The laser processing apparatus according to claim 5, wherein the workpiece is a semiconductor wafer having a plurality of devices thereon and the laser beam applying unit processes the workpiece with the laser beam by way of ablation by focusing the laser beam, which has a wavelength absorbable by the wafer, along one of a plurality of projected dicing lines.

7. The laser processing apparatus according to claim 6, wherein the captured image produced by the image capturing unit is acquired by the control unit at certain intervals while the laser processing apparatus is uninterruptedly processing the workpiece with the laser beam.

8. The laser processing apparatus according to claim 7, wherein the laser beam is shaped into an elliptical cross-sectional shape.

9. The laser processing apparatus according to claim 8, wherein the laser beam is of an elliptical shape whose minor axis is aligned with the direction of the one of a plurality of projected dicing lines and whose major axis is aligned with the widthwise directions of the one of a plurality of projected dicing lines.

10. The laser processing apparatus according to claim 9, wherein the size of the captured image is determined by the output power level of the laser beam.

11. The laser processing apparatus according to claim 1, wherein the captured image produced by the image capturing unit is acquired by the control unit at certain intervals while the laser processing apparatus is uninterruptedly processing the workpiece with the laser beam.

12. The laser processing apparatus according to claim 1, wherein the laser beam is shaped into an elliptical cross-sectional shape.

13. The laser processing apparatus according to claim 1, wherein the control unit determines the laser processing apparatus is malfunctioning on a basis of the shape of the captured image.

14. The laser processing apparatus according to claim 1, wherein the control unit determines the laser processing apparatus is malfunctioning on a basis of the shape of the captured image from a face side of the workpiece.

15. The laser processing apparatus according to claim 2, wherein the size of the captured image and the reference image are determined by the respective output power levels of the laser beam.

16. The laser processing apparatus according to claim 2, wherein the storage section stores a plurality of reference images produced by the image capturing sensor through capturing of light emitted from the workpiece when the laser beam is applied under predetermined conditions to the workpiece by the laser beam applying unit, each of the plurality of reference images being associated with a different output power levels of the laser beam and
  wherein the comparing section is configured to compare the captured image of the light with the reference images stored in the storage section, and
  wherein the determining section determines a state of the laser beam on a basis of a result of the comparison between the captured image of the light and the reference images from the comparing section.

17. A laser processing apparatus comprising:
  a chuck table for holding a workpiece thereon;
  a laser beam applying unit for applying a laser beam to the workpiece held on the chuck table;
  an image capturing sensor for producing a captured image of the workpiece that includes a captured image of light emitted from the workpiece when the laser beam is applied to the workpiece by the laser beam applying unit; and
  a control unit, wherein
  the laser beam applying unit includes:
    a laser oscillator for emitting a laser beam, and
    a condensing lens for converging the laser beam emitted from the laser oscillator onto the workpiece, and
  the control unit includes a determining section for determining a state of the laser beam applied to the workpiece, on a basis of a shape of the captured image of the light that is included in the captured image of the workpiece,
  wherein the control unit further includes:
    a storage section for storing a reference image produced by the image capturing sensor through capturing of light emitted from the workpiece when the laser beam is applied under a predetermined condition to the workpiece by the laser beam applying unit, and
    a comparing section for comparing the captured image of the light with the reference image stored in the storage section, and
  the determining section determines a state of the laser beam on a basis of a result of the comparison between the captured image of the light and the reference image from the comparing section,
  wherein the storage section stores a plurality of reference images produced by the image capturing sensor through capturing of light emitted from the workpiece when the laser beam is applied under predetermined conditions to the workpiece by the laser beam applying unit, each of the plurality of reference images being associated with a different output power levels of the laser beam and
  wherein the comparing section is configured to compare the captured image of the light with the reference images stored in the storage section, and
  wherein the determining section determines a state of the laser beam on a basis of a result of the comparison between the captured image of the light and the reference images from the comparing section,
  wherein the size of the captured image and the reference images are determined by the respective output power levels of the laser beam.

* * * * *